United States Patent [19]
Baker

[11] Patent Number: 5,973,512
[45] Date of Patent: Oct. 26, 1999

[54] CMOS OUTPUT BUFFER HAVING LOAD INDEPENDENT SLEWING

[75] Inventor: Alan J. Baker, Loveland, Colo.

[73] Assignee: National Semiconductor Corporation, Santa Clara, Calif.

[21] Appl. No.: 08/982,959

[22] Filed: Dec. 2, 1997

[51] Int. Cl.$^6$ ............................ H03K 19/03; H03K 19/94
[52] U.S. Cl. ................................. 326/87; 326/83; 326/17; 326/21
[58] Field of Search .................................. 326/83, 87, 21, 326/17, 121; 327/110

[56] References Cited

U.S. PATENT DOCUMENTS

| | | | |
|---|---|---|---|
| 5,008,568 | 4/1991 | Leung et al. | 326/27 |
| 5,160,860 | 11/1992 | Runaldue | 326/98 |
| 5,262,690 | 11/1993 | Cochran et al. | 307/601 |
| 5,266,847 | 11/1993 | Kuo | 307/475 |
| 5,452,333 | 9/1995 | Guo et al. | 375/371 |
| 5,467,464 | 11/1995 | Oprescu et al. | 395/550 |
| 5,489,861 | 2/1996 | Seymour | 327/108 |
| 5,576,635 | 11/1996 | Partovi et al. | 326/27 |
| 5,748,019 | 5/1998 | Wong et al. | 327/170 |
| 5,808,481 | 9/1998 | Thompson | 326/83 |
| 5,883,531 | 3/1999 | Kuo | 327/108 |

Primary Examiner—Jon Santamauro
Assistant Examiner—Richard Roseen
Attorney, Agent, or Firm—Limbach & Limbach L.L.P.

[57] ABSTRACT

A buffer having an output slew rate which is relatively insensitive to loading and supply voltage. The output buffer includes an output node, a first half-circuit and a second half-circuit. The first half-circuit is for slewing the output node from a first voltage to a second voltage. The first half-circuit includes a first output transistor connected between the output node and a second voltage reference node, a first switching device connected from a gate of the first output transistor to the second voltage reference node, a second switching device connected from the gate of the output transistor to a first node, a first current source connected from a first voltage reference node to the first node, and a first capacitor connected from the output node to the first node. The second half-circuit is for slewing the output node from the second voltage to the first voltage. The second half-circuit includes a second output transistor connected between the output node and the first voltage reference node, a third switching device connected from the gate of the second output transistor to the first voltage reference node, a fourth switching device connected from the gate of the second output transistor to a second node, a second current source connected from the second voltage reference node to the second node, and a second capacitor connected from the output node to the second node.

30 Claims, 3 Drawing Sheets

CMOS OUTPUT BUFFER HAVING LOAD INDEPENDENT SLEWING

BACKGROUND OF THE INVENTION

1. Field of the Invention

The present invention relates to output buffers, and more particularly to a CMOS output buffer having a relatively constant output slew rate, independent of loading, due to a fast gate voltage error recovery.

2. Description of the Related Art

Conventional CMOS output buffers are sensitive to loading. That is, the output slew rate (or rise time) is a function of the capacitance connected to the buffer. The larger the capacitance, the slower the output slew rate (or rise time). If a very small capacitive load is connected to the output buffer, then the output slew rate may be very large, which can cause interference with adjacent circuitry. If a very large capacitive load is connected to the buffer, then the slew rate may be so low that at high data rates the output of the buffer will never reach its final value before switching again. Either condition is undesirable. Conventional CMOS output buffers also have some slew rate sensitivity to supply voltages.

A conventional CMOS buffer can be optimized to drive a particular load with a particular supply voltage. However, where the load and/or the supply voltage may vary (for example, where one device is used in a variety of applications), it would be desirable to have a CMOS output buffer which has a controlled and constant slew rate, which is relatively insensitive to loading or supply.

SUMMARY OF THE INVENTION

The present invention provides a half-buffer and a buffer with the foregoing advantages, i.e. an output slew rate which is relatively insensitive to loading and supply voltage. The half-buffer may include an output node and an output transistor having a conduction path connected between the output node and a first voltage reference node. A first switching device is connected between a gate of the output transistor and the first voltage reference node, and a second switching device is connected between the gate of the output transistor and a first node. A capacitor is connected between the output node and the first node and is configured to transfer a first charge through the second switching device to alter a voltage potential of the gate of the output transistor. A current source is connected to the first node and configured to charge the capacitor.

Alternatively, the buffer of the present invention may include an output node, a first half-circuit and a second half-circuit. The first half-circuit is for slewing the output node from a first voltage to a second voltage. The first half-circuit includes a first output transistor connected between the output node and a second voltage reference node, a first switching device connected from a gate of the first output transistor to the second voltage reference node, a second switching device connected from the gate of the output transistor to a first node, a first current source connected from a first voltage reference node to the first node, and a first capacitor connected from the output node to the first node. The second half-circuit is for slewing the output node from the second voltage to the first voltage. The second half-circuit includes a second output transistor connected between the output node and the first voltage reference node, a third switching device connected from the gate of the second output transistor to the first voltage reference node, a fourth switching device connected from the gate of the second output transistor to a second node, a second current source connected from the second voltage reference node to the second node, and a second capacitor connected from the output node to the second node.

The present invention also provides a method of buffering a digital signal. The method includes the steps of: establishing an output node; establishing an output transistor having a conduction path between the output node and a first voltage reference node; coupling a gate of the output transistor to the first voltage reference node; charging a capacitor that is connected to the output node with a current source connected to a second voltage reference node; coupling the capacitor to and decoupling the first voltage reference node from the gate of the output transistor in response to the digital signal transitioning from a first state to a second state; redistributing a charge stored in the capacitor to the gate of the output transistor to alter a voltage potential at the gate of the output transistor; turning the output transistor on in response to redistribution of the charge; integrating the current of the current source onto the capacitor to slew the voltage of the output node at a nearly constant rate; and decoupling the capacitor from and coupling the first voltage reference node to the gate of the output transistor in response to the digital signal transitioning from the second state to the first state.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
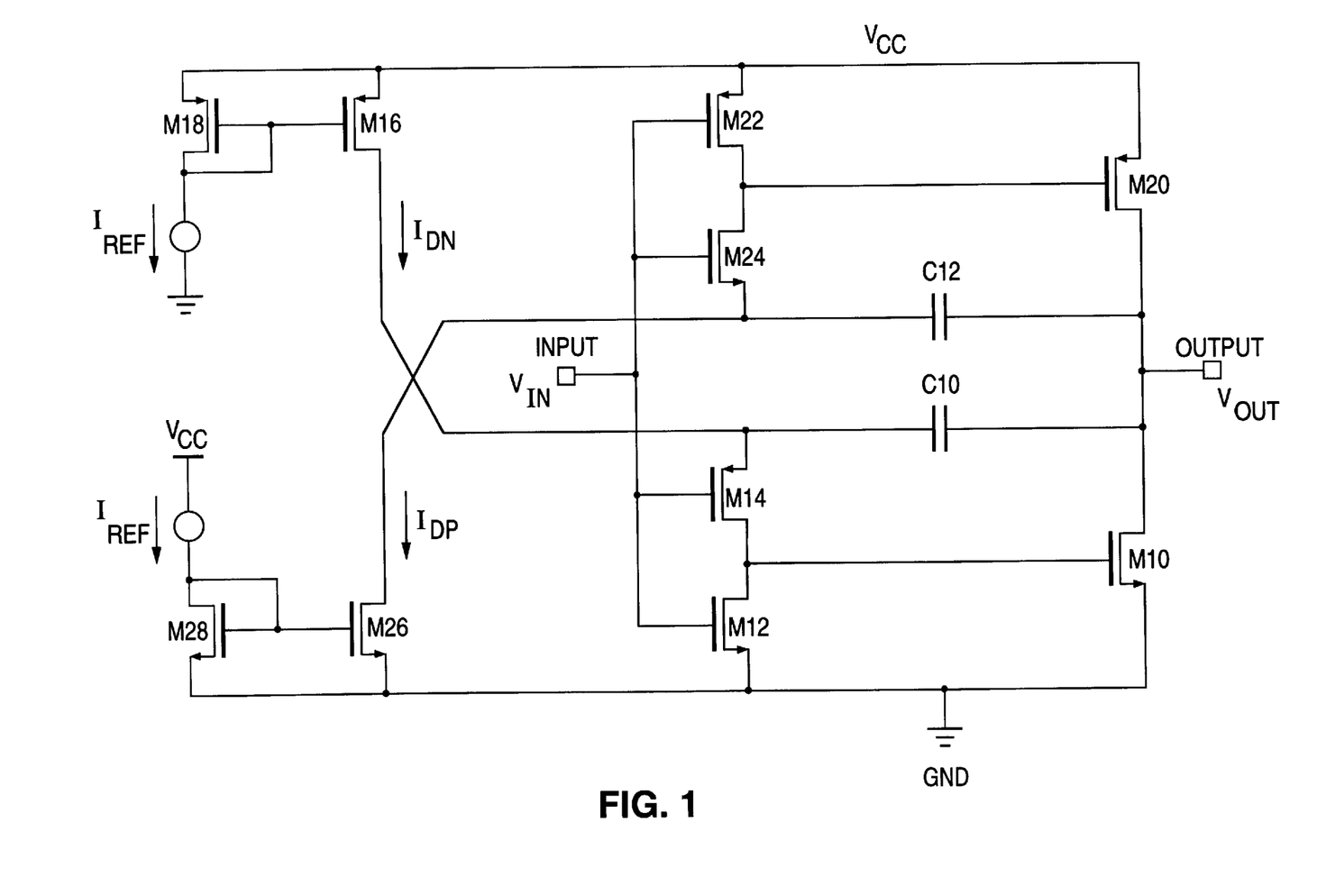
FIG. 1 is a schematic diagram illustrating a CMOS output buffer in accordance with the present invention.

Referring to FIG. 1, there is illustrated a CMOS output buffer 10 in accordance with the present invention. The buffer is capable of maintaining a relatively constant output slew rate, due to fast gate voltage error recovery, while operating at high data rates, e.g., a data on the order of 40 Mbps.

An input signal is received by the buffer 10 at the input $V_{IN}$. Transistors M10, M14, and M16 along with capacitor C10 act to control the slewing of the output $V_{OUT}$ from a high level ($V_{CC}$) to a low level (GROUND). Transistors M20, M24, M26, and C12 act to control the slewing of the output from a low level (GROUND) to a high level ($V_{CC}$). Transistors M12 and M22 act to turn off devices M10 and M20 respectively.

The operation of the buffer 10 will be discussed with reference to FIG. 2 which shows a simplified version of one-half of the buffer 10, designated as the half-buffer 20. The half-buffer 20 represents the negative slewing half buffer. Transistors M20, M22, M24 and M26, together with capacitor C12 from FIG. 1, form the positive slewing half buffer, and are not shown in FIG. 2. Transistors M12, M14 act as switches and therefore are shown as switches or switching devices. Transistor M16 acts as a current source during slewing and therefore is shown as a current source. Output transistor M10 acts as a gain element (specifically a voltage controlled current source) during slewing and therefore is shown as a transistor. Additionally, two other elements have been added to FIG. 2; CN represents the gate-source capacitance of transistor M10 and CL represents the load capacitance.

In general, each half-circuit of the output buffer 10 has four states defined as the off state, the precharge state, the slewing state, and the on state. With reference to the half-circuit 20, when the switching device M12 is closed and the switching device M14 is open, the half-circuit 20 is in the off state. When the switching device M12 is opened and the switching device M14 is closed, the half-circuit 20 moves through the precharge state, the slewing state, and the on state in succession. During the precharge state, charge is rapidly transferred from capacitor C10 to the gate of output transistor M10 through the switching device M14. During the slewing state, output transistor M10 acts as a voltage controlled current source, and the current provided by current source M16 is integrated onto capacitor C10. This integrating action defines and controls the output slew rate. During the on state, output transistor M10 holds the output node $V_{OUT}$ at ground potential.

During the off state of the half-circuit 20, output transistor M10 is off, i.e. no current is conducted from the output node to ground, and the source of transistor M14 has been charged to $V_{CC}$ by current source M16 (once that potential is reached, current source M16 is in its linear region and provides no additional current). Additionally, in the off state the switching device M14 is open, the switching device M12 is closed (setting the gate of output transistor M10 at ground potential), and the output node $V_{OUT}$ is at the $V_{CC}$ reference potential.

During the precharge state the switching device M12 is open, the switching device M14 is closed, and charge is rapidly transferred from capacitor C10 to the gate of output transistor M10 through the switching device M14.

During the slewing state, output transistor M10 acts as a voltage controlled current source, and the current provided by current source M16 is integrated onto capacitor C10. In the slewing state the switching device M14 remains closed, and the switching device M12 remains open.

During the on state, output transistor M10 acts as a low impedance connection from the output node $V_{OUT}$ to ground potential. Current source M16 charges the gate of output transistor M10 and the source of transistor M14 to the $V_{CC}$ reference potential.

The detailed operation of the half-buffer 20 can be described as follows. First assume that the input $V_{IN}$ has been high so that transistor M14 has been open and transistor M12 has been closed. Consequently, transistor M10 has been "off" and the positive slewing half buffer has pulled the output $V_{OUT}$ up to $V_{CC}$. During the time that transistor M14 is open, the gate side of capacitor C10 is charged to a potential of $V_{CC}$ by current source M16. It should be noted that once the gate node is charged to $V_{CC}$, transistor M16 no longer acts as a current source, but is biased in its linear region with zero current flowing.

Figure 2:
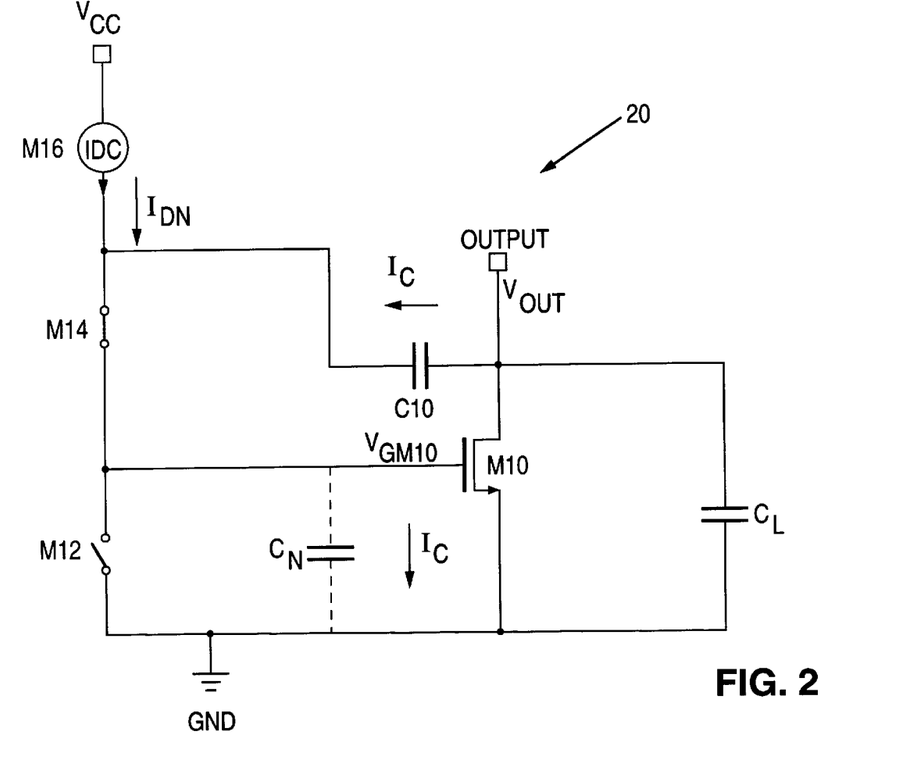
FIG. 2 is a schematic diagram illustrating the negative slewing half-buffer of the CMOS output buffer shown in FIG. 1.
Figure 3:
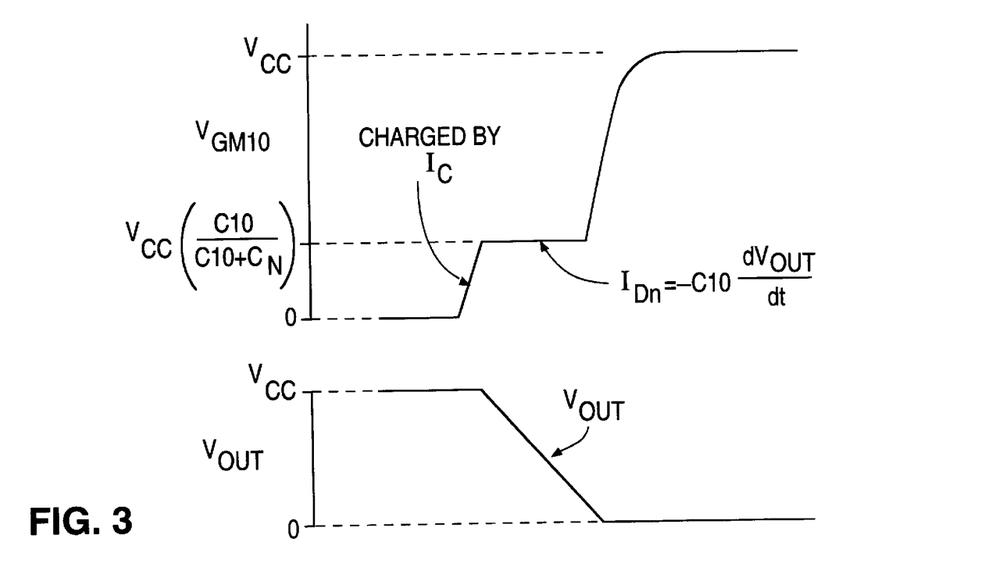
FIG. 3 is a timing diagram illustrating the operation of the half-buffer shown in FIG. 2.

When the input $V_{IN}$ goes low, transistors M12, M14 transition to the state shown in FIG. 2, i.e., transistor M12 opens and transistor M14 closes. This causes an immediate redistribution of charge from capacitor C10, indicated as charging current $I_C$, through transistor M14 and to capacitance $C_N$. As shown in FIG. 3, the charging current $I_C$ rapidly pulls the gate potential $V_{GM10}$ of transistor M10 from ground to a potential which is set by the ratio of the two capacitances C10 and $C_N$. The charging current $I_C$ only persists for a very short time. The gate voltage $V_{GM10}$ of transistor M10 after charge redistribution is described by the following charge redistribution equation:

$$V_{GM10} = \left(\frac{C10}{C10 + C_N}\right) V_{CC}$$

Once transistor M10 has been turned on, it acts as the gain element in an integrator. Current $I_{DN}$ supplied by transistor M16 (which has left the linear region of operation and now acts as a current source) flows through capacitor C10. The output slew rate is established by the value of $I_{DN}$ and the value of capacitor C10 according to the following equation:

$$\frac{dV_{OUT}}{dt} = -\frac{I_{DN}}{C10}$$

The above equation represents the "steady-state" slewing condition. If the gate of transistor M10 is not charged to the correct potential to achieve this output slew rate, then the integrator will act to adjust the gate potential of transistor M10 to achieve this slew rate.

The gate voltage $V_{GM10}$ of transistor M10 should preferably be that voltage which establishes the proper current in transistor M10 in order to slew the load capacitance $C_L$ at the proper rate. For example, assume that the load capacitance $C_L$ is 10 pF and that we want to slew the output at a rate of 1 V/ns. The current required to slew the load capacitance $C_L$ is 10 mA, so the gate voltage $V_{GM10}$ of transistor M10 needs to be that voltage which establishes 10 mA of current in transistor M10. It can be shown that the required steady state "on-voltage" for transistor M10 is equal to:

$$V_{SS} \sqrt{\frac{C_L I_{DN}}{kC10}} = \sqrt{\frac{C_L}{k}\left(-\frac{dV_{OUT}}{dt}\right)}$$

$V_{SS}$ is the steady-state on-voltage, $C_L$ is the load capacitance, and k is a constant associated with device M10. The steady-state on-voltage is the potential above the transistor threshold voltage that must be established at the gate of transistor M10 to support the output slew rate.

The half-buffer 20, and thus the CMOS output buffer 10, has a very fast gate voltage error recovery. That is, if the correct on-voltage is not established at the gate of transistor M10, the error is corrected very quickly. This is advantageous because the faster the error is corrected, the more constant the output slew rate will be. There are at least two reasons for the half-buffer 20's fast error recovery. First, the total capacitance connected to the gate of transistor M10 is relatively low. This is accomplished by using capacitor C10 to provide the charging current to the gate of transistor M10, as opposed to using a separate capacitor to accomplish the precharge function. The lower the total capacitance connected to the gate of transistor M10, the faster the gate voltage error recovery. Second, capacitor C10 is sized to deliberately overcharge the gate of transistor M10 instead of undercharging it. The circuit corrects faster if too much voltage is applied at the gate of transistor M10 as opposed to having too little voltage at the gate of M10. Capacitor C10 is sized to provide the correct on-voltage for the largest expected load capacitance. This way the circuit rapidly corrects the gate voltage when smaller values of load capacitance are connected. The capacitors C10, C12 will normally be different in size because the equivalent $C_N$ for each half circuit will normally be different.

The positive slewing half-buffer, i.e. transistors M20, M22, M24, M26 and capacitor C12, operates in the same manner as the negative slewing half-buffer 20 to slew the output $V_{OUT}$ from low to high. This buffer operates out of phase with respect to the negative slewing half-buffer, i.e. it is off while the negative stewing half-buffer is slewing or on, and slewing or on while the negative half-buffer is off.

By way of example, the capacitance values for C10 and C12 may be 0.15 pF and 0.4 pF respectively. Also by way of example, the transistors shown in FIG. I may have the channel widths and lengths specified in Table I below. However, it should be understood that all of these specified values are only example values and that other values for the capacitors and transistors may be used in accordance with the present invention.

TABLE 1

| Transistor | Example Channel Width ($\mu$m) | Example Channel Length ($\mu$m) |
|---|---|---|
| M10 | 400 | 0.8 |
| M12 | 5 | 0.8 |
| M14 | 11 | 0.8 |
| M16 | 132 | 1.1 |
| M18 | 22 | 1.1 |
| M20 | 600 | 0.8 |
| M22 | 11 | 0.8 |
| M24 | 5 | 0.8 |
| M26 | 80 | 1.0 |
| M28 | 5 | 1.0 |

Figure 4:
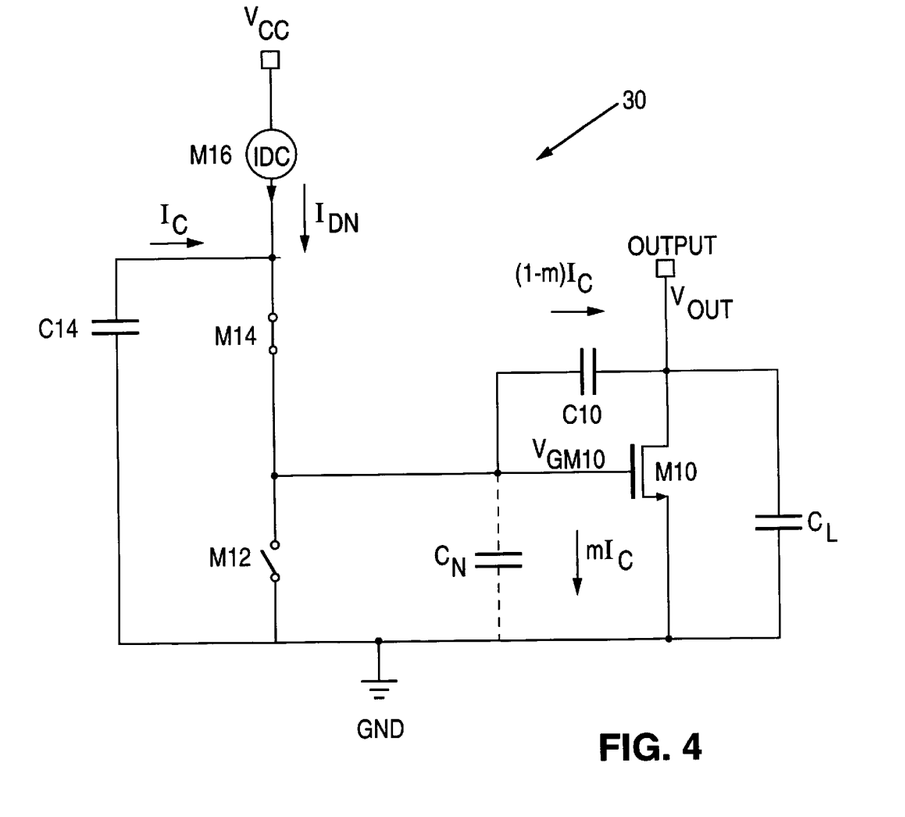
FIG. 4 is a schematic diagram illustrating one-half of a CMOS output buffer of a different design.

In order to illustrate that reducing the total capacitance connected to the gate of transistor M10 and deliberately overcharging the gate of transistor M10 will speed-up the gate voltage error recovery, the characteristics of a CMOS output buffer of a different design will be examined. Referring to FIG. 4 there is illustrated a CMOS half-buffer 30 similar to that disclosed in U.S. patent application Ser. No. 08/912,436, filed Aug. 18, 1997, now U.S. Pat. No. 5,883,531 for "UNIVERSAL SERIAL BUS DRIVER HAVING MOS TRANSISTOR GATE CAPACITOR". The contents of this application are hereby fully incorporated into the present application by reference.

The devices in the half-buffer 30 which correspond to devices in the half-buffer 20 have been given the same designator, e.g., transistors M10, M12, M14, M16, and capacitances C10, $C_L$, $C_N$. However, the half-buffer 30 includes a different connection, as well as an extra capacitor. Specifically, capacitor C10 in the half-buffer 30 is connected to the gate of transistor M10 rather than the node between transistors M14, M16. Furthermore, the half-buffer 30 includes an additional capacitor C14 which is connected between ground and the node between transistors M14, M16 to provide the charging current $I_C$.

In order to describe the operation of the half-buffer 30, first assume that transistor M14 has been open and transistor M12 has been closed. Consequently, transistor M10 has been "off", the complementary half-circuit (not shown) has pulled the output up to $V_{CC}$, and the gate side of capacitor C14 has been charged to a potential of $V_{CC}$ by current source M16.

When transistors M12, M14 transition to the state shown in FIG. 4, i.e., transistor M12 opens and transistor M14 closes, there is an immediate redistribution of charge from capacitor C14 to capacitors $C_N$ and C10 due to charging current $I_C$. The gate potential $V_{GM10}$ of transistor M10 is rapidly pulled from ground to a potential which is set by the ratio of the three capacitances $C_N$, C10, C14. The voltage at the gate of transistor M10 after charge redistribution is described by the equation:

$$V_{GM10} = \left(\frac{C14}{C14 + C_N + C10}\right) V_{CC}$$

Similar to the half-buffer 20 described above, once transistor M10 has been turned on, it acts as the gain element in an integrator. Current $I_{DN}$ supplied by transistor M16 flows through capacitor C10. The output slew rate is established by the value of $I_{DN}$ and the value of capacitor C10:

$$\frac{dV_{OUT}}{dt} = -\frac{I_{DN}}{C10}$$

Again, the equation above represents the "steady-state" slewing condition, and if the gate of transistor M10 is not charged to the correct potential to achieve this output slew rate, then the integrator will act to adjust the gate potential of transistor M10.

Figure 5:
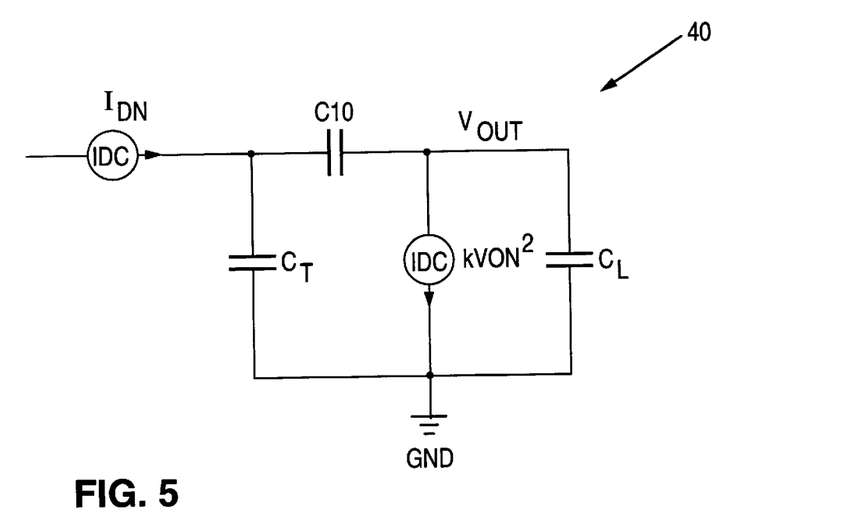
FIG. 5 is a schematic diagram illustrating a model of the circuit shown in FIG. 4.

The voltage at the gate of transistor M10 should preferably be that voltage which establishes the proper current in transistor M10 in order to slew the load capacitance $C_L$ at the proper rate. Referring to FIG. 5, there is illustrated a circuit model 40 of the half-buffer 30 that is useful for analyzing its operation and for calculating the correct gate potential $V_{GM10}$ to achieve the desired output slew rate. The two node equations for the circuit model 40 are:

$$I_{DN} = C_T \dot{V}_{ON} + C10(\dot{V}_{ON} - \dot{V}_{OUT})$$

$$0 = C10(\dot{V}_{OUT} - \dot{V}_{ON}) + C_L \dot{V}_{OUT} + k V_{ON}^2$$

The dot notation signifies the time derivative. The capacitance $C_T$ represents the sum of the capacitances at the gate of transistor M10, and k is a constant associated with device M10. Solving these two equations for the derivative of the on-voltage results in:

$$\dot{V}_{ON} = \frac{(C_L + C10) I_{DN}}{C_T C_L + C10 C_L + C_T C10} - \frac{C10 k V_{ON}^2}{C_T C_L + C10 C_L + C_T C10}$$

Assuming $C_L \gg C10$, the equation reduces to:

$$\dot{V}_{ON} = \frac{I_{DN}}{C_T + C10} - \frac{C10 k V_{ON}^2}{C_L (C_T + C10)}$$

Under steady-state conditions the time derivative of the on-voltage is zero. The steady-state on-voltage, $V_{SS}$, may be found by solving the equation above for $V_{ON}$:

$$V_{SS} = \sqrt{\frac{C_L I_{DN}}{k C10}}$$

The total on-voltage under transient conditions is the sum of the steady-state voltage and an error voltage:

$$V_{ON} = V_e + V_{SS}$$

Combining the three equations above results in an expression for the time derivative of the error voltage:

$$\dot{V}_\varepsilon = -\left(\frac{kC10}{C_L(C_T + C10)}\right)(V_\varepsilon^2 + V_{SS}V_\varepsilon)$$

This first-order non-linear differential equation does not have a closed form solution. However, it allows some important conclusions about the half-buffer 30 to be drawn. First, the rate of change of the error voltage is larger when $V_e$ is greater than zero than when $V_e$ is less than zero. This means that over charging the gate of transistor M10 is better than under charging it because the buffer will recover faster. Also, minimizing $C_T$ (which minimizes the denominator) will result in a larger rate of change in the error voltage, and hence, a faster recovery time.

Therefore, as discussed above, the gate voltage will correct faster if too much voltage is applied at the gate of transistor M10 as opposed to having too little voltage at the gate of transistor M10 and if the total capacitance connected to the gate of transistor M10 can be reduced. Thus, the half-buffer 20 of the present invention (FIG. 2) speeds up the gate error voltage recovery over the half-buffer 30 by reducing the total capacitance connected to the gate of transistor M10 and by sizing capacitor C10 so that the gate of transistor M10 is overcharged. In the half-buffer 20, the connection of capacitor C10 is changed so that it provides the charging current $I_C$ instead of capacitor C14, and then capacitor C14 is eliminated.

Another disadvantage of the half-buffer 30 is that a fraction of the charge redistribution current $I_C$ flows through capacitor C10 in a direction which charges the load capacitance $C_L$ opposite the desired direction. That is, the output voltage $V_{OUT}$ initially goes positive before it begins slewing in a negative direction. This causes undesirable preshoot in the output waveform.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A half-buffer, comprising:
   an output node;
   an output transistor having a conduction path connected between the output node and a first voltage reference node;
   a first switching device connected between a gate of the output transistor and the first voltage reference node;
   a second switching device connected between the gate of the output transistor and a first node;
   a capacitor connected between the output node and the first node and configured to transfer a first charge through the second switching device to alter a voltage potential of the gate of the output transistor; and
   a current source connected to the first node and configured to charge the capacitor.

2. A half-buffer according to claim 1, wherein the output transistor comprises an n-channel transistor having a drain connected to the output node and a source connected to the first voltage reference node.

3. A half-buffer according to claim 1, wherein the output transistor comprises a p-channel transistor having a drain connected to the output node and a source connected to the first voltage reference node.

4. A half-buffer according to claim 1, wherein the first switching device comprises an n-channel transistor and the second switching device comprises a p-channel transistor.

5. A half-buffer according to claim 1, wherein the first switching device comprises a p-channel transistor and the second switching device comprises an n-channel transistor.

6. A half-buffer according to claim 1, wherein the current source is connected from a second voltage reference node to the first node and the current source has a constant current output when a voltage across the current source is greater than a first value and which provides a low resistance path when the voltage across the current source is less than a second value.

7. A half-buffer according to claim 6, wherein the current source comprises:
   a first p-channel transistor having a drain connected to the first node and a source connected to the second voltage reference node.

8. A half-buffer according to claim 6, wherein the current source comprises:
   a first n-channel transistor having a drain connected to the first node and a source connected to the second voltage reference node.

9. A half-buffer, comprising:
   an output node;
   an output transistor having a conduction path connected between the output node and a first voltage reference node;
   a first transistor having a drain connected to a gate of the output transistor and a source connected to the first voltage reference node;
   a second transistor having a drain connected to the gate of the output transistor and a source connected to a first node;
   a capacitor connected between a drain of the output transistor and the first node and configured to transfer a first charge through the second transistor to alter a voltage potential of the gate of the output transistor; and
   a current source connected to the first node and configured to charge the capacitor.

10. A half-buffer according to claim 9, wherein the output transistor comprises an n-channel transistor having a drain connected to the output node and a source connected to the first voltage reference node.

11. A half-buffer according to claim 9, wherein the output transistor comprises a p-channel transistor having a drain connected to the output node and a source connected to the first voltage reference node.

12. A half-buffer according to claim 9, wherein the first transistor comprises an n-channel transistor and the second transistor comprises a p-channel transistor.

13. A half-buffer according to claim 9, wherein the first transistor comprises a p-channel transistor and the second transistor comprises an n-channel transistor.

14. A half-buffer according to claim 9, wherein the current source is connected from a second voltage reference node to the first node and the current source has a constant current output when a voltage across the current source is greater than a first value and which provides a low resistance path when the voltage across the current source is less than a second value.

15. A half-buffer according to claim 14, wherein the current source comprises:
   a first p-channel transistor having a drain connected to the first node and a source connected to the second voltage reference node.

16. A half-buffer according to claim 14, wherein the current source comprises:
a first n-channel transistor having a drain connected to the first node and a source connected to the second voltage reference node.

17. A half-buffer, comprising:
an output node;
an input node;
an output n-channel transistor having a drain connected to the output node and a source connected to a first voltage reference node;
a first n-channel transistor having a drain connected to a gate of the output n-channel transistor, a source connected to the first voltage reference node, and a gate connected to the input node;
a first p-channel transistor having a drain connected to the gate of the output n-channel transistor and a gate connected to the input node;
a capacitor connected between the drain of the output n-channel transistor and a source of the first p-channel transistor; and
a current source connected to the source of the first p-channel transistor.

18. A half-buffer according to claim 17, wherein the current source comprises:
a second p-channel transistor having a source connected to a second voltage reference node and a drain connected to the source of the first p-channel transistor.

19. A half-buffer, comprising:
an output node;
an input node;
an output p-channel transistor having a drain connected to the output node and a source connected to a first voltage reference node;
a first n-channel transistor having a drain connected to a gate of the output p-channel transistor and a gate connected to the input node;
a first p-channel transistor having a drain connected to the gate of the output p-channel transistor, a source connected to the first voltage reference node, and a gate connected to the input node;
a capacitor connected between the drain of the output p-channel transistor and a source of the first n-channel transistor; and
a current source connected to the source of the first n-channel transistor.

20. A half-buffer according to claim 19, wherein the current source comprises:
a second n-channel transistor having a source connected to a second voltage reference node and a drain connected to the source of the first n-channel transistor.

21. A buffer, comprising:
an output node;
a first half-circuit for slewing the output node from a first voltage to a second voltage, the first half-circuit including,
a first output transistor connected between the output node and a second voltage reference node,
a first switching device connected from a gate of the first output transistor to the second voltage reference node,
a second switching device connected from the gate of the output transistor to a first node,
a first current source connected from a first voltage reference node to the first node, and
a first capacitor connected from the output node to the first node;
a second half-circuit for slewing the output node from the second voltage to the first voltage, the second half-circuit including,
a second output transistor connected between the output node and the first voltage reference node,
a third switching device connected from the gate of the second output transistor to the first voltage reference node,
a fourth switching device connected from the gate of the second output transistor to a second node,
a second current source connected from the second voltage reference node to the second node, and
a second capacitor connected from the output node to the second node.

22. A buffer according to claim 21, wherein the first output transistor comprises an n-channel transistor having a drain connected to the output node and a source connected to the second voltage reference node, and the second output transistor comprises a p-channel transistor having a drain connected to output node and a source connected to the first voltage reference node.

23. A buffer according to claim 21, wherein:
the first switching device comprises an n-channel transistor having a drain connected to the gate of the first output transistor and a source connected to the second voltage reference node; and
the second switching device comprises a p-channel transistor having a drain connected to the gate of the first output transistor and a source connected to the first node.

24. A buffer according to claim 21, wherein:
the third switching device comprises a p-channel transistor having a drain connected to the gate of the second output transistor and a source connected to the first voltage reference node; and
the fourth switching device comprises an n-channel transistor having a drain connected to the gate of the second output transistor and a source connected to the second node.

25. A buffer according to claim 21, wherein:
the first current source comprises a first p-channel transistor having a source connected to the first voltage reference node and a drain connected to the first node; and
the second current source comprises a first n-channel transistor having a source connected to the second voltage reference node and a drain connected to the second node.

26. A method of buffering a digital signal, comprising the steps of:
establishing an output node;
establishing an output transistor having a conduction path between the output node and a first voltage reference node;
coupling a gate of the output transistor to the first voltage reference node;
charging a capacitor that is connected to the output node with a current source connected to a second voltage reference node;
coupling the capacitor to and decoupling the first voltage reference node from the gate of the output transistor in response to the digital signal transitioning from a first state to a second state;

redistributing a charge stored in the capacitor to the gate of the output transistor to alter a voltage potential at the gate of the output transistor;

turning the output transistor on in response to redistribution of the charge;

integrating the current of the current source onto the capacitor to slew the voltage of the output node at a nearly constant rate; and decoupling the capacitor from and coupling the first voltage reference node to the gate of the output transistor in response to the digital signal transitioning from the second state to the first state.

27. A method according to claim 26, wherein the step of coupling the capacitor to and decoupling the first voltage reference node from the gate of the output transistor comprises the steps of:

turning on a first transistor connected between the capacitor and the gate of the output transistor; and turning off a second transistor connected between the gate of the output transistor and the first voltage reference node.

28. A method according to claim 26, wherein the step of decoupling the capacitor from and coupling the first voltage reference node to the gate of the output transistor comprises the steps of:

turning off a fist transistor connected between the capacitor and the gate of the output transistor; and turning on a second transistor connected between the gate of the output transistor and the first voltage reference node.

29. A method according to claim 26, wherein the step of charging a capacitor that is connected to the output node with a current source comprises the steps of:

charging the capacitor with a first transistor having a drain connected to the capacitor and a source connected to the second voltage reference node.

30. A method of buffering a digital signal, comprising the steps of:

establishing an output node;

establishing a first output transistor having a conduction path between the output node and a first voltage reference node;

establishing a second output transistor having a conduction path connected between the output node and a second voltage reference node;

coupling a gate of the first output transistor to the first voltage reference node;

charging a first capacitor that is connected to the output node with a first current source connected to the second voltage reference node;

coupling the first capacitor to and decoupling the first voltage reference node from the gate of the first output transistor in response to the digital signal transitioning from a first state to a second state;

decoupling a second capacitor from and coupling the second voltage reference node to the gate of the second output transistor in response to the digital signal transitioning from the first state to the second state;

redistributing a first charge stored on the first capacitor to the gate of the first output transistor to alter a voltage potential at the gate of the first output transistor;

turning the first output transistor on in response to redistribution of the first charge;

turning the second output transistor off in response to the coupling of the second voltage reference node to the gate of the second output transistor;

integrating the current of the first current source onto the first capacitor to slew the voltage of the output node to the first voltage reference node at a nearly constant rate;

charging the second capacitor that is connected to the output node with a second current source connected to the first voltage reference node;

coupling the second capacitor to and decoupling the second voltage reference node from the gate of the second output transistor in response to the digital signal transitioning from the second state to the first state;

decoupling the first capacitor from and coupling the first voltage reference node to the gate of the first output transistor in response to the digital signal transitioning from the second state to the first state;

redistributing a second charge stored on the second capacitor to the gate of the second output transistor to alter a voltage potential at the gate of the second output transistor;

turning the second output transistor on in response to redistribution of the second charge;

turning the first output transistor off in response to the coupling of the first voltage reference node to the gate of the first output transistor;

integrating the current of the second current source onto the second capacitor to slew the voltage of the output node to the second voltage reference node at a nearly constant rate.

* * * * *

UNITED STATES PATENT AND TRADEMARK OFFICE
CERTIFICATE OF CORRECTION

PATENT NO.: 5,973,512
DATED: October 26, 1999
INVENTOR(S): ALAN J. BAKER

It is certified that an error appears in the above-identified patent and that said Letters Patent is hereby corrected as shown below:

In Col. 11, line 27, delete "fist" and replace with --first--.

Signed and Sealed this

Second Day of May, 2000

Attest:

Q. TODD DICKINSON

*Attesting Officer*    *Director of Patents and Trademarks*